United States Patent [19]

Mathew

[11] Patent Number: 5,804,880
[45] Date of Patent: Sep. 8, 1998

[54] SOLDER ISOLATING LEAD FRAME

[75] Inventor: Ranjan J. Mathew, San Jose, Calif.

[73] Assignee: National Semiconductor Corporation, Santa Clara, Calif.

[21] Appl. No.: 740,835

[22] Filed: Nov. 4, 1996

[51] Int. Cl.⁶ .......................... H01L 23/48; H01L 23/52; H01L 29/40; H01L 23/495
[52] U.S. Cl. .......................... 257/779; 257/666; 257/724; 257/784
[58] Field of Search ................................... 257/666, 779, 257/784, 724

[56] References Cited

U.S. PATENT DOCUMENTS

| | | | |
|---|---|---|---|
| 3,859,722 | 1/1975 | Kinsky et al. | 29/626 |
| 4,087,906 | 5/1978 | Cobaugh et al. | 29/630 D |
| 4,183,611 | 1/1980 | Casciotti et al. | 339/275 B |
| 4,210,926 | 7/1980 | Hacke | 23/48 |
| 5,229,640 | 7/1993 | Pak | 257/666 |
| 5,319,243 | 6/1994 | Leicht et al. | 257/692 |
| 5,483,105 | 1/1996 | Kaja et al. | 257/779 |
| 5,629,563 | 5/1997 | Takiar et al. | 257/723 |

OTHER PUBLICATIONS

Unknown, *"DC/DC Converter in IC Package Eases Power Supply Design–in,"* Package Technology Newsletter, National Semiconductor Corp., vol. 2, No. 3, Summer 1996.

*Primary Examiner*—Jerome Jackson
*Assistant Examiner*—Teresa M. Arroyo
*Attorney, Agent, or Firm*—Beyer & Weaver, LLP

[57] ABSTRACT

Disclosed is a lead frame and method for making a lead frame that is at least partially coated with a non-wettable material that is substantially anti-adhesive to solder materials. Once the non-wetting layer is applied to the lead frame, selected regions of the lead frame are plated with a wettable material that is solderable and bondable. In this manner, a solder paste may be used to attach a discrete component to selected regions of the wettable material, and wire bonds may be attached to other regions of the wettable material. Advantageously, the solder material is substantially prevented from spreading over portions of the lead frame coated with the non-wettable material.

14 Claims, 9 Drawing Sheets

SOLDER ISOLATING LEAD FRAME

BACKGROUND OF THE INVENTION

The present invention relates generally to the packaging of integrated circuits. More particularly, the invention relates to lead frame designs used for packaging semiconductor devices and discrete components.

An important concern in the integrated circuit packaging industry is maintaining a sufficiently high yield of packaged devices. As is well known in the art, there are many factors that can adversely impact packaging yields. By way of example, in some cases a semiconductor device being packaged may be mishandled causing irreparable damage to sub-micron size features. In other cases, the packaging equipment or packaging process itself may be responsible for reducing the number of properly functioning packaged devices. It is therefore commercially import to identify and eliminate potentially damaging packaging operations which typically render very expensive packaged devices unusable.

In packaging semiconductor devices and discrete components, a soldering operation has been found to cause a number failures in the resulting packaged device. By way of example, when the lead frames themselves form part of the electrical routing connections for a packaged device, a number of discrete components, e.g., capacitors, inductors, resistors, transistors must be soldered directly to a lead frame. A problem commonly encountered is that the soldering material used to attach the discrete components to the lead frame may overflow from under the discrete components and destructively contact a semiconductor device that is attached to the lead frame. An other problem encountered by the overflowing solder material is that locking holes formed into the lead frame to bond a subsequently applied encapsulating material are filled with solder material. When this happens, the encapsulating material will not be able to fill the locking holes and may detach from over the lead frame causing compete destruction of the packaged device.

Figure 1A:
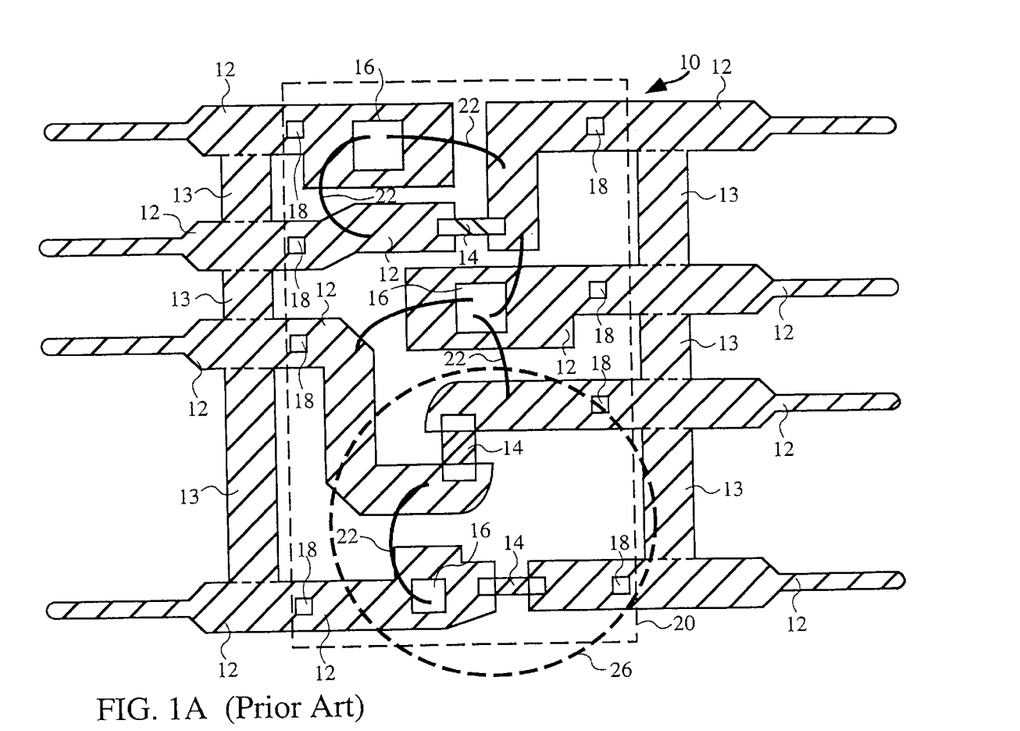
FIG. 1A shows a packaged device having a lead frame used to establish conductive interconnections.

FIG. 1A illustrates a packaged device 10 that uses a lead frame 12 to form part of the conductive interconnections. As shown, a number of discrete components 14 and a number of semiconductor devices 16 are attached to lead frame 12. Once attached, a number of bonding wires 22 are used to form electrical interconnections between semiconductor devices 16 and portions of lead frame 12. Lead frame 12 is also shown having a number of locking holes 18 that are used to assure that an encapsulant 20 remains locked to lead frame 12 once packaging is complete. After the encapsulation process is complete, dam bars 13 that are used for structural support during packaging are trimmed away.

Figure 1B:
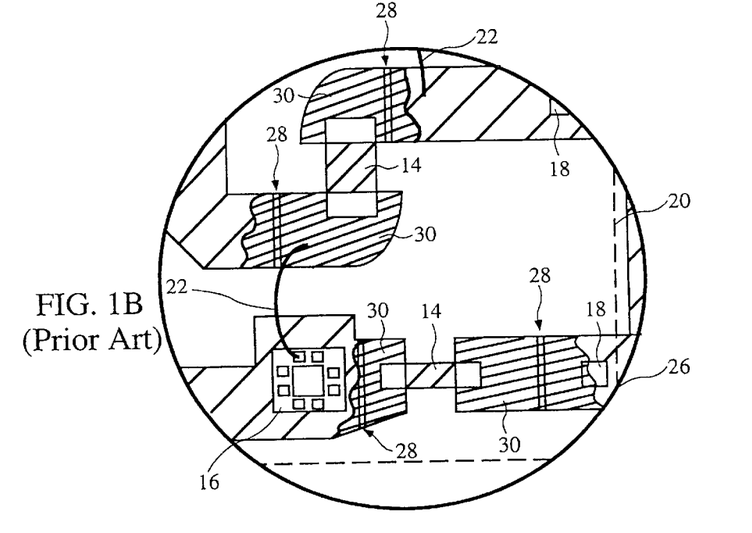
FIG. 1B shows a magnification of a portion of the packaged device of FIG. 1A.

FIG. 1B is a magnification 26 of a portion of packaged device 10. As shown, solder material 30 that is used to attach discrete components 14 to lead frame 12 tends to overflow from under discrete components 14. As described above, a particular problem is that solder material 30 will come into contact with semiconductor device 16. As is well known in the art, if solder material comes into contact with a side of semiconductor device 16, semiconductor device 16 may be short circuited when various micron and sub-micron thick layers are electrically connected by the solder material 30. Unfortunately, when semiconductor device 16 is damaged, the entire packaged device 10 will be rendered useless.

An other problem described above is illustrated by solder material 30 flowing towards and into a locking hole 18. Clearly, if locking holes 18 are filled with solder material 30, encapsulating material 20 may not bond well to lead frame 12 and may potentially detach. Of course, if encapsulating material 20 detaches, the entire packaged device 10 will be damaged when the encapsulant rips off bonding wire interconnections, and lifts off discrete components.

Yet another problem resulting from the overflowing solder material 30 is possible contamination of wire bonding regions. As shown in FIG. 1B, if solder material 30 overflows and covers portions of lead frame 12 where subsequent wire bonding is needed to complete selected electrical interconnections, these needed bonding regions will become contaminated. By way of example, if a bonding region is contaminated with solder material 30, bonding wires 22 may not properly adhere to lead frame 12 which can cause bonding wires 22 to detach when the encapsulation material is injected over lead frame 12. Of course once bonding wires become detached, the packaged device 10 will unfortunately fail to function properly.

As shown in FIG. 1B, prior attempts to prevent solder material 30 from overflowing included machining "V" grooves 28 directly onto lead frame 12. Although machining grooves 28 includes an additional fabrication step that increases packaging costs, grooves 28 were intended to contain solder material 30. Unfortunately, grooves 28 fail to sufficiently prevent solder material 30 from overflowing. In addition, generating even deeper "V" grooves 28 would not be possible without endangering the structural stability of lead frame 12.

In view of the forgoing, what is needed is a lead frame and a method for making a lead frame that will prevent solder material used to attach discrete components from flowing up against semiconductor devices, into lead frame locking holes, and contaminating wire bonding regions.

SUMMARY OF THE INVENTION

To achieve the foregoing in accordance with the purpose of the present invention, an innovative lead frame and method for making a lead frame is disclosed. In one embodiment, the lead frame is at least partially coated with a non-wettable material which is anti-adhesive to a solder materials. Once the non-wetting layer is applied, regions of the lead frame are plated with a wettable material that is solderable and bondable. In this manner, a solder paste may be used to attach a discrete component to a solderable region and wire bonds may be attached to bondable regions.

Advantageously, when the solder paste liquefies and begins to flow, the molten solder paste will be substantially confined to the wettable material. Thus, the non-wettable material provides a barrier for preventing the molten solder paste from spreading over portions of the lead frame where damage may occur. Once the discrete components are soldered to the wettable material, any water-soluble flux residue that may have migrated over portions of the lead frame can be washed away leaving the lead frame substantially free of flux residue.

In another embodiment, a method of attaching a discrete component to a lead frame is disclosed. The lead frame will preferably include a plurality of conductive attach pads that are bounded by a non-wettable material. The non-wettable material is preferably a nickel metallic that is specifically suited to substantially prevent the overflow of solder material away from the conductive attach pads. A discrete component is then soldered to the lead frame such that the discrete component is attached to at least one of the attach pads. Once the lead frame is heated to flow the solder material used to attach the discrete component, the lead frame is washed to substantially remove any flux residue produced by the flux material when the lead frame was heated.

In yet another embodiment, a lead frame packaging structure is disclosed. The lead frame preferably includes a multiplicity of leads used to provide electrical connection to components within the packaged structure. The lead frame includes a non-wettable material at least partially covering the lead frame such that the solder material does not substantially stick to the non-wettable material. Then, a plurality of conductive attach pads being defined over selected portions of the lead frame. Preferably, the non-wettable material is a nickel material, and the conductive attach pads are defined from a silver material.

Although the advantages are numerous, one advantage is that solder material used to attach discrete components to a lead frame will be substantially prevented from flowing into and filling any lead frame locking holes which could have reduced the bonding strength of the encapsulating material. Further, wire bonding regions of the lead frame are protected from contaminating solder material, and semiconductor chips that are attached to the lead frame are protected from short circuits caused when solder materials flow towards the edges of the semiconductor chips.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

FIGS. 1A and 1B have been described above to point out some of the disadvantages associated overflowing solder materials used to attach discrete components to a lead frame.

Broadly speaking, the present invention discloses an innovative lead frame and method for making a lead frame that is at least partially coated with a non-wettable material that is substantially anti-adhesive to solder materials. Once the non-wetting layer is applied, regions of the lead frame are plated with a wettable material that is solderable and bondable. In this manner, a solder paste may be used to attach a discrete component to the solderable regions and wire bonds may be attached to bondable regions. In one embodiment, discrete components may include both passive components such as resistors, capacitors, inductors and crystals, and active components such as transistors. Advantageously, any solder overflow will remain over the wettable material and is substantially bounded by the non-wettable material covering the lead frame. Once the discrete components are soldered to the wettable material, any flux residue lying over portions of the lead frame may be washed away leaving the non-wetting material substantially free of solder material.

Figure 2A:
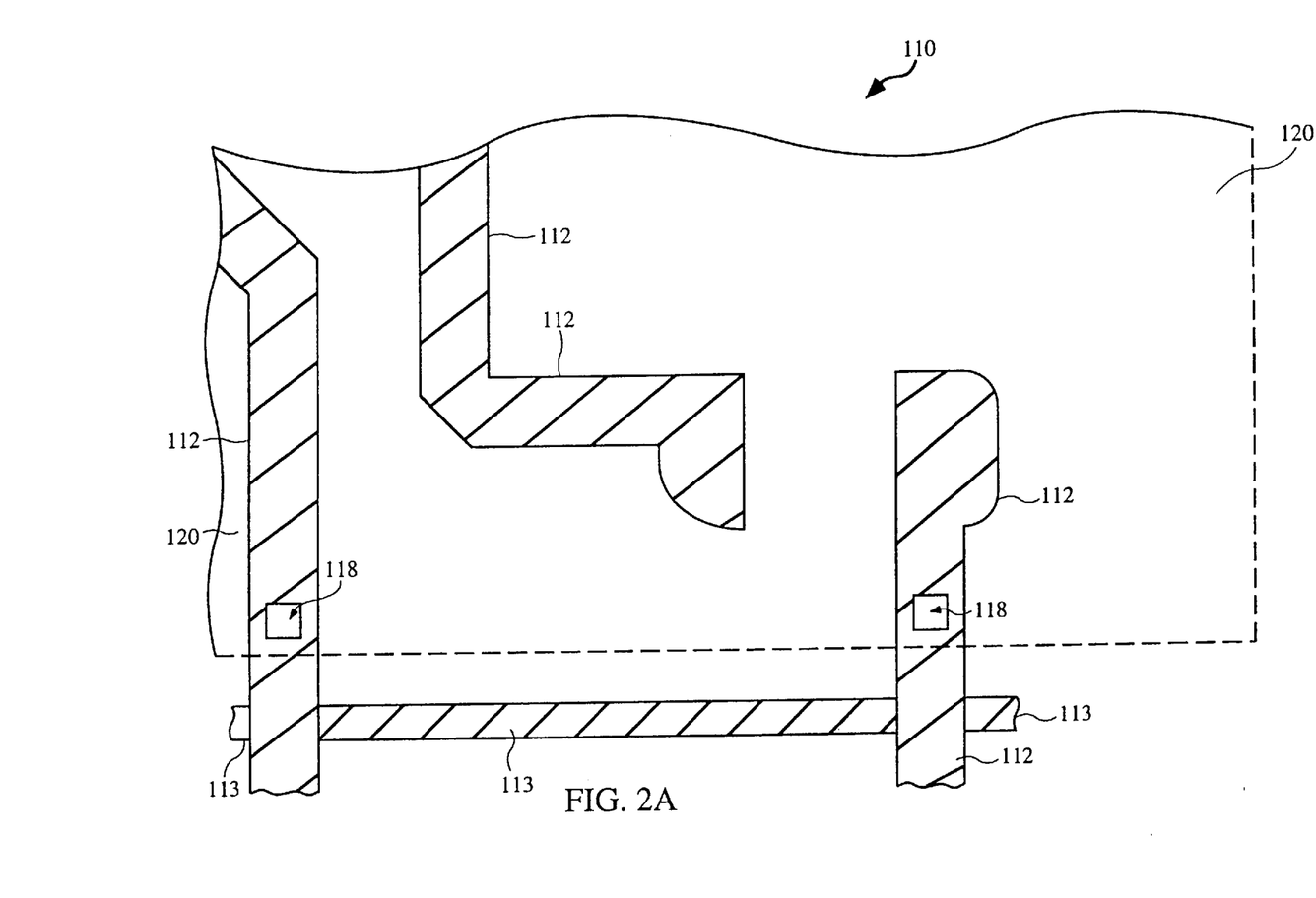
FIG. 2A is a diagrammatic illustration of a lead frame segment in accordance with one embodiment of present invention.

FIG. 2A is a diagrammatic illustration 110 of a segment of a lead frame 112. As shown, lead frame 112 will preferably have locking holes 118 that serve to lock in and secure encapsulating material that is injected over lead frame 112 after one or more semiconductor devices, discreet components, and bond wires are attached to lead frame 112. By way of example, a dashed line represents the boundary where an encapsulating material 120 is applied once the aforementioned devices are properly attached and interconnected to lead frame 112. As is well known in the art, dam bar 113 is initially an integral part of lead frame 112 which provides structural support to the leads of lead frame 112 during the packaging process.

Thus, once encapsulating material is applied and hardened, dam bar 113 and other portions of a lead frame panel are trimmed away. In this manner, each lead of lead frame 112 can function independently of each other, and the selective interconnections formed between lead frame 112 lying under the encapsulated area are able to provide the desired function. In this embodiment, lead frame 112 will preferably be formed from a conductive copper panel. In practice, each copper panel may be used to form several lead frames having the same lead frame pattern. Therefore, forming multiple copper lead frames from a single copper panel facilitates automation of the packaging process. Although copper is preferred for lead frame 112, other suitable materials may be used as well.

Figure 2B:
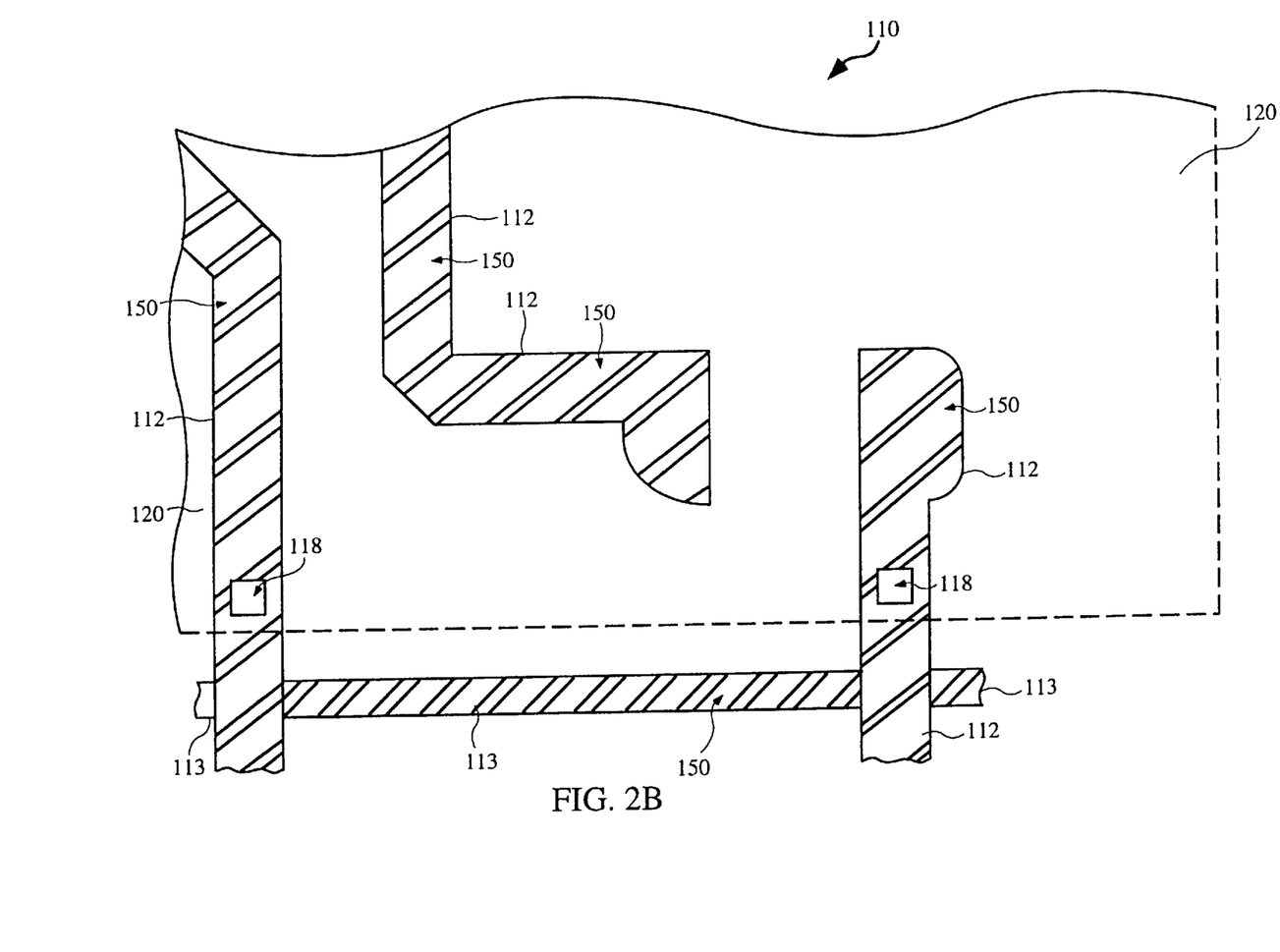
FIG. 2B shows the diagrammatic illustration of FIG. 2A after a non-wetting material is coated over the lead frame in accordance with one embodiment of present invention.

FIG. 2B shows the diagrammatic illustration 110 of FIG. 2A after a non-wetting material 150 is coated over lead frame 112. In one embodiment, wetting material 150 will preferably coat the entire lead frame 112 including dam bars 113. In this manner, no additional costly masking operations will be required. Non-wetting material 150 may be any number of suitable materials such as nickel, cobalt, nickel-iron, tin-nickel, chromium, aluminum, titanium and molybdenum. In this embodiment, a nickel material is preferably electro-deposited over the copper surface of lead frame 112. Although electro-deposition is preferred, other suitable plating processes may include other well known metallic sputtering techniques. Preferably, non-wetting material 150 is plated to a thickness of between about 0.1 microns and about 8 microns, and more preferably, between about 0.5 microns and about 3 microns, and most preferably, about 1 micron.

Figure 3:
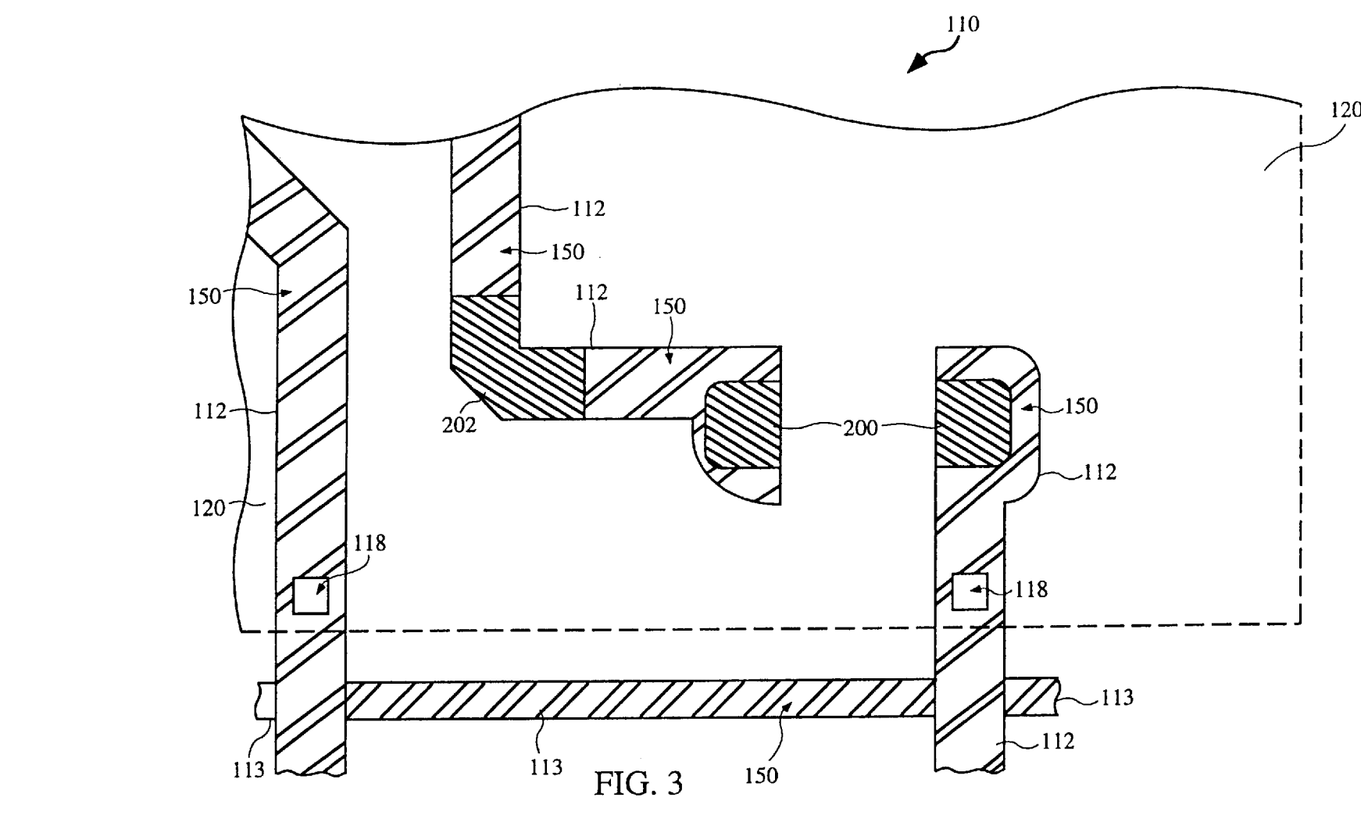
FIG. 3 shows the diagrammatic illustration of FIG. 2B after a wetting material is plated over selected portions of lead frame in accordance with one embodiment of the present invention.

FIG. 3 shows the diagrammatic illustration 110 of FIG. 2B after a wetting material has been plated over selected portions of lead frame 112. In this example, a pair of conductive attach pads 200 (e.g., solder landings) and a bonding region 202 is shown to have been plated on top of non-wetting material 150. Conductive attach pads 200 are preferably plated with a suitable solderable material such as silver, palladium, gold, tin, tin-lead or a conductive alloy. In this embodiment, conductive attach pads 200 are preferably plated with silver using any well known electroplating process or electrolyses process. Preferably, the silver material is deposited to a thickness of between about 0.5 microns and about 4 microns, and more preferably, between about 1 micron and about 3 microns, and most preferably, about 2 microns. Alternatively, if palladium is used, palladium will be deposited to a thickness of between about 0.05 microns and about 0.5 microns, and more preferably, between about 0.075 microns and about 0.2 microns, and most preferably, about 0.1 microns.

For bonding regions 202, suitable plating materials include, for example, silver, palladium, and gold. As described above, if silver is used, a preferred thickness will be between about 1 micron and about 3 microns, and most preferably, about 2 microns. Alternatively, if palladium is used for plating bonding regions 202, the thickness of palladium will preferably be between about 0.075 microns and about 0.2 microns, and most preferably, about 0.1 microns. At this stage, all portions of lead frame 112 designed to accept discrete components or bonding wires have been coated with an appropriate plating material to prevent oxidation and assure strong adhesion to lead frame 112.

Figure 4:
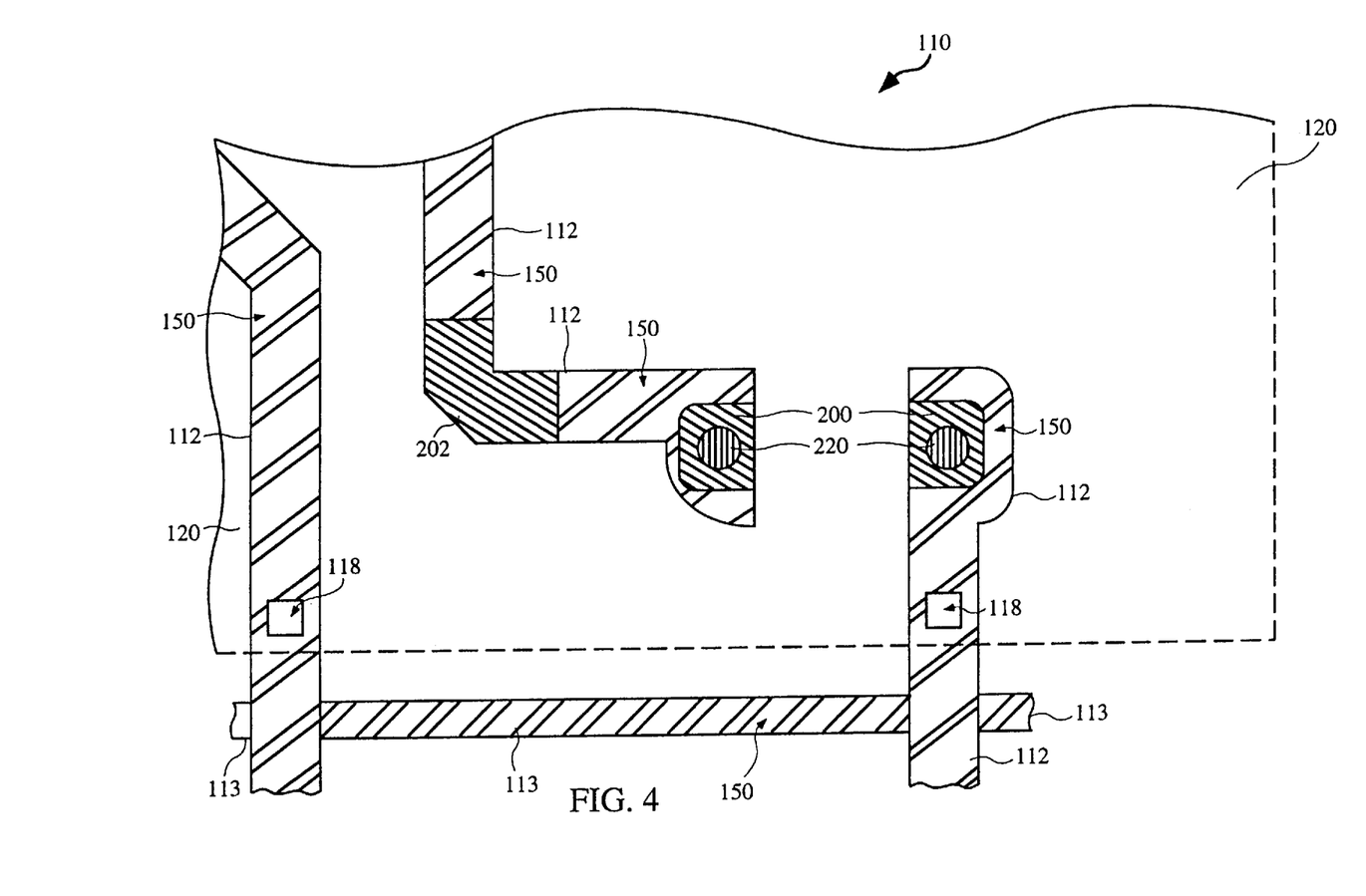
FIG. 4 shows the diagrammatic illustration of FIG. 3 after a solder paste is applied over portions of the wetting material in accordance with one embodiment of the present invention.

FIG. 4 shows the diagrammatic illustration 110 of FIG. 3 after a solder paste 220 is applied over conductive attach pads 200. Solder paste 220 is preferably composed of solder metals and flux. In this embodiment, the solder flux material will preferably be one that contains water-soluble or low-resin flux. By way of example, one type of solder paste is a "no-clean LR725"™ that is available from Alpha Metals, Inc. of Jersey City, N.J. In this embodiment, solder paste 220 will preferably be composed of tin, lead, and flux. The approximate percentage of tin will preferably be between about 60% and about 70%, and more preferably, about 63 %, the approximate percentage of lead will preferably be between about 30% and about 40%, and more preferably about 37%, and the approximate percentage of flux will preferably be between about 10 % and about 30%, and more preferably, about 20%. In another embodiment, solder paste 220 may include any number of suitable metals such as silver, lead, and metal alloys.

Solder paste 220 can be applied using any number of suitable application techniques. In one embodiment, solder paste 220 is preferably applied to conductive attach pads 200 using a solder dispensing apparatus that is typically driven by pneumatic control systems. Other suitable application techniques include screen printing and transfer printing techniques. In addition, solder paste 220 is preferably applied at a room temperature of between about 20° C. and about 30° C., and more preferably, between about 22° C., and about 28° C., and most preferably, about 25° C.

Figure 5A:
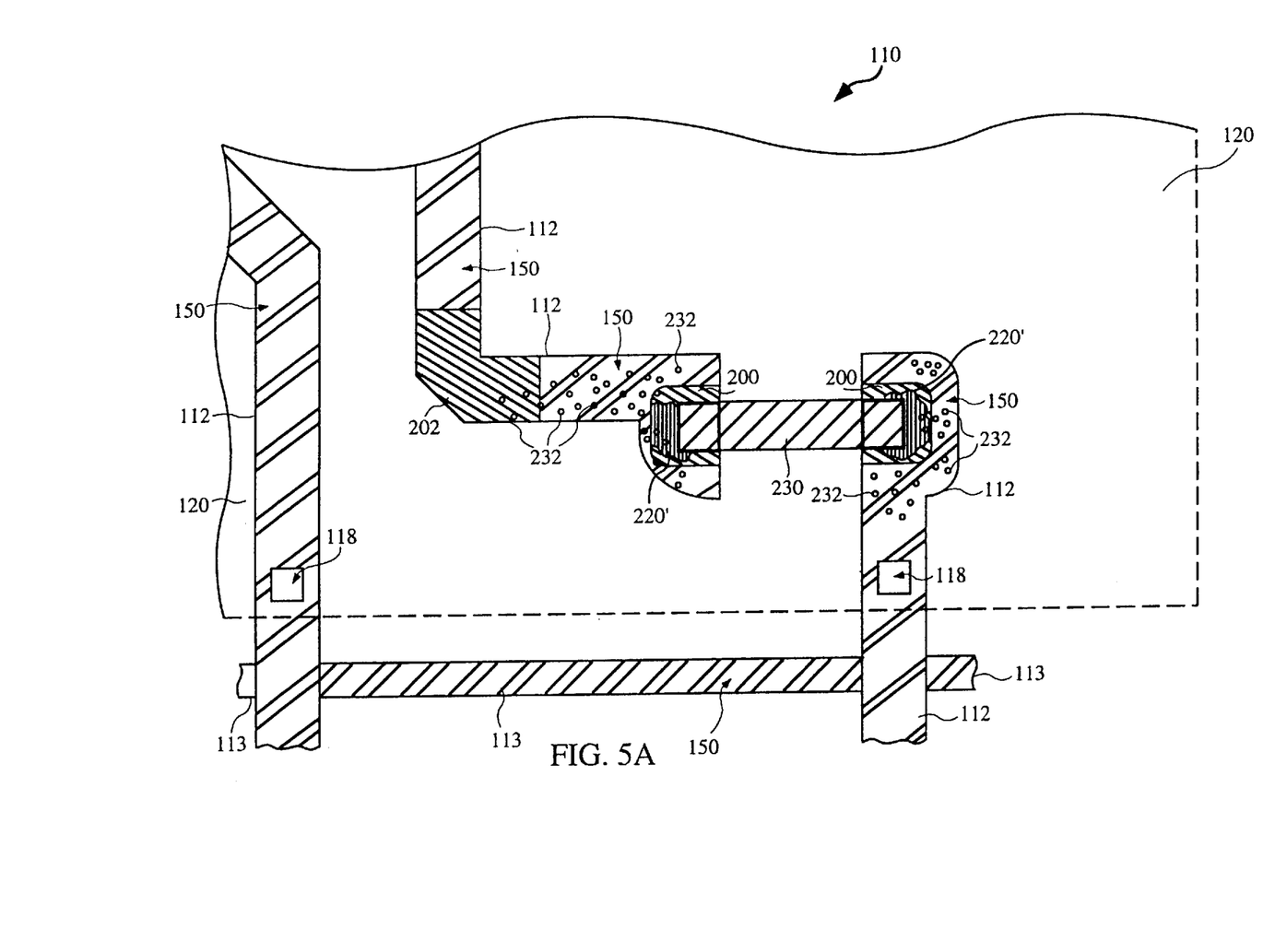
FIG. 5A shows the diagrammatic illustration of FIG. 4 after a discrete component is placed over the solder paste and is subjected to heat in accordance with one embodiment of the present invention.

FIG. 5A shows the diagrammatic illustration 110 of FIG. 4 after a discrete component 230 is placed over solder paste 220 and is subjected to sufficient heat. In this manner, discrete device 230 will electrically adhere to conductive attach pads 200 when the solder paste liquefies. As shown, when exposed to heat, solder paste 220 transforms from a pasty substance into a molten solder paste 220' that is advantageously confined to conductive attach pads 200. As described above, because non-wetting material 150 bounds conductive attach pads 200, molten solder paste 220' will be substantially prevented from spreading to portions of lead frame 112 where damage may occur to the packaged device.

In this embodiment heating is preferably performed by placing lead frame 112 having one or more discrete components 230 into an infrared reflow furnace (not shown). The reflow furnace is preferably heated to a temperature of between about 80° C. and about 330° C., and more preferably, between about 185° C. and about 250° C., and most preferably, about 220° C. Once lead frame 112 is placed into the infrared reflow furnace, lead frame 112 is maintained in the reflow furnace for a sufficient period of time such that solder paste 220 becomes molten solder paste 220'. Preferably, lead frame 112 is kept in the reflow furnace for between about 20 seconds and about 150 seconds, and more preferably, between about 30 seconds and about 120 seconds, and most preferably, about 50 seconds.

Further, in this embodiment, infrared reflow furnace is preferably filled with either 100% nitrogen gas, or a mixture of nitrogen gas and oxygen. If a mixture of nitrogen gas and oxygen is used, the preferred percentage of nitrogen gas is between about 95% and about 100%, and most preferably, between about 98% and about 99.99%, and most preferably, about 99.9999% nitrogen. Alternatively, solder paste 220 may be reflowed in an air containing furnace.

Once lead frame 112 is removed from the infrared reflow furnace and cooled down, a flux residue 232 will remain over portions of lead frame 112 and the now hardened molten solder paste 220'. As shown, flux residue 232 will typically simmer over and flow around and away from conductive attach pads 200 and onto portions of non-wetting layer 150. In some cases, flux residue 232 may flow over portions of bonding regions 202 and locking holes 118. To remove flux residue 232, lead frame 112 will typically be subjected to a cleaning process to remove flux residue 232 from over non-wetting material 150, conductive attach pads 200, molten solder paste 220', bonding regions 202 and discrete component 230.

Figure 5B:
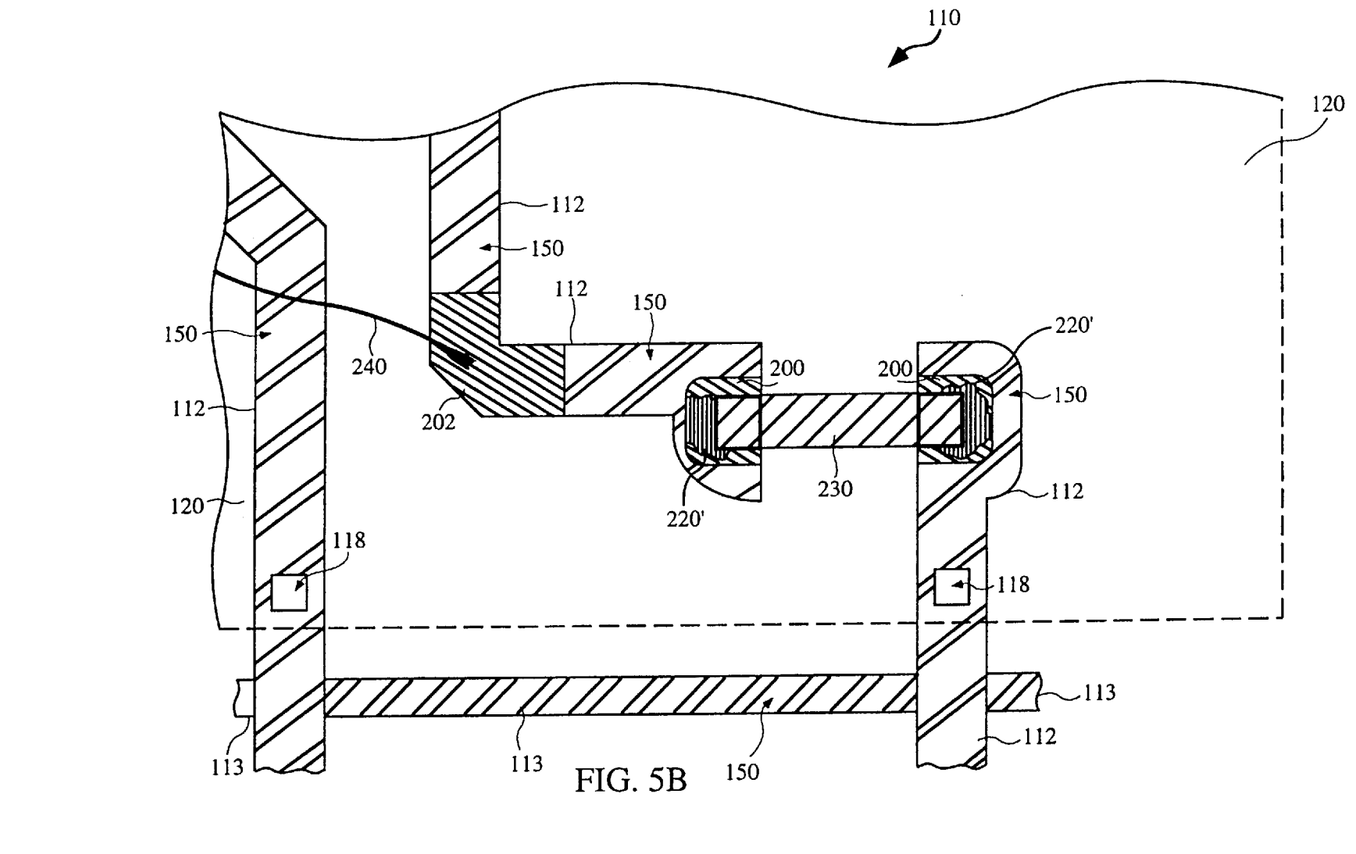
FIG. 5B shows the diagrammatic illustration of FIG. 5A after the resulting flux residue is washed away in accordance with one embodiment of the present invention.

FIG. 5B shows the diagrammatic illustration 110 after a water rinse cleaning process has been performed to remove flux residue 232 which prevents the contamination of bonding regions 202. As illustrated, the resulting molten solder paste 220' has effectively been confined to conductive attach pads 200 and prevented from flowing towards locking holes 118 and bonding region 202. In particular, the non-wetting material 150 has essentially formed a barrier that prevented molten solder paste 220' from flowing toward regions of lead frame 112 where problems may occur. Once cleaning has been performed, any necessary wire bonding may be performed without the risk of contamination. As is well known in the art, any number of wire bonds may be used to interconnect the various leads and components in a packaged device. In this example, a wire bond 240 is shown bonded to bonding regions 202.

Figure 6:
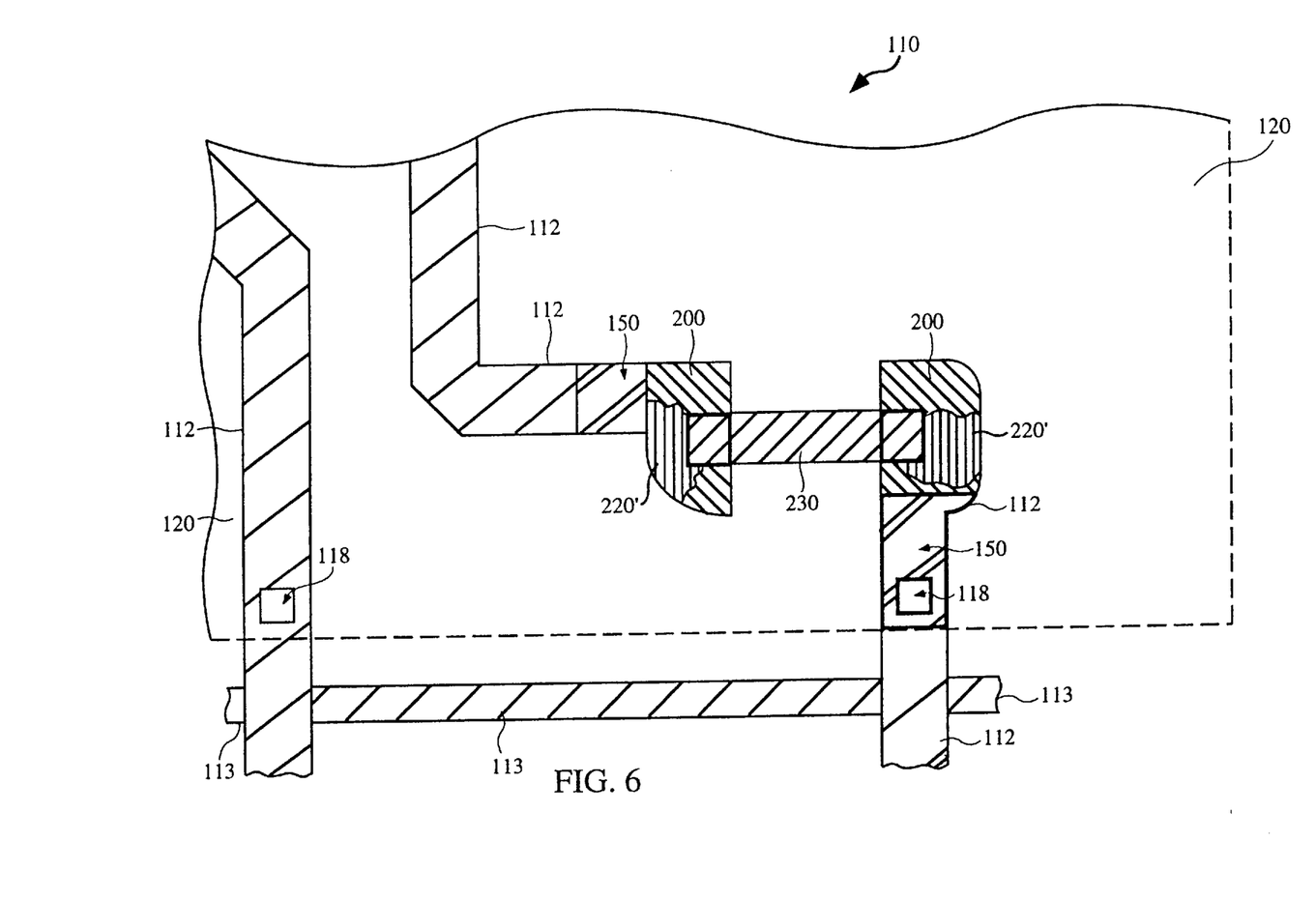
FIG. 6 shows an alternative embodiment where a non-wetting material is selectively applied over lead frame in accordance with one embodiment of the present invention.

FIG. 6 shows an alternative embodiment where a non-wetting material 150 is selectively applied (e.g., as barriers) to lead frame 112. In this embodiment, lead frame 112 is not completely coated with a non-wetting material, and is alternatively coated on selected portions of lead frame 112 in order to prevent molten solder paste 220' from flowing towards portions of the lead frame where damage may occur. As described above, conductive attach pads 200 will preferably be electroplated with a silver material to assure a strong adhesion and prevent oxidation of lead frame 112 after soldering.

Further, if flux residue spreads to portions of lead frame 112 where problems may occur, a water rinse process may be performed to remove the flux as described above. As illustrated, molten solder paste 220' will be prevented from reaching locking holes 118 (e.g., destructively filling the locking holes) and will also be prevented from flowing to other portions of lead frames 112 where contamination is possible. Although molten solder paste 220' is shown covering only portions of conductive attach pads 200, molten solder paste 220' may spread to cover the entire conductive attach pads 200 depending on the amount of solder paste used.

Figure 7:
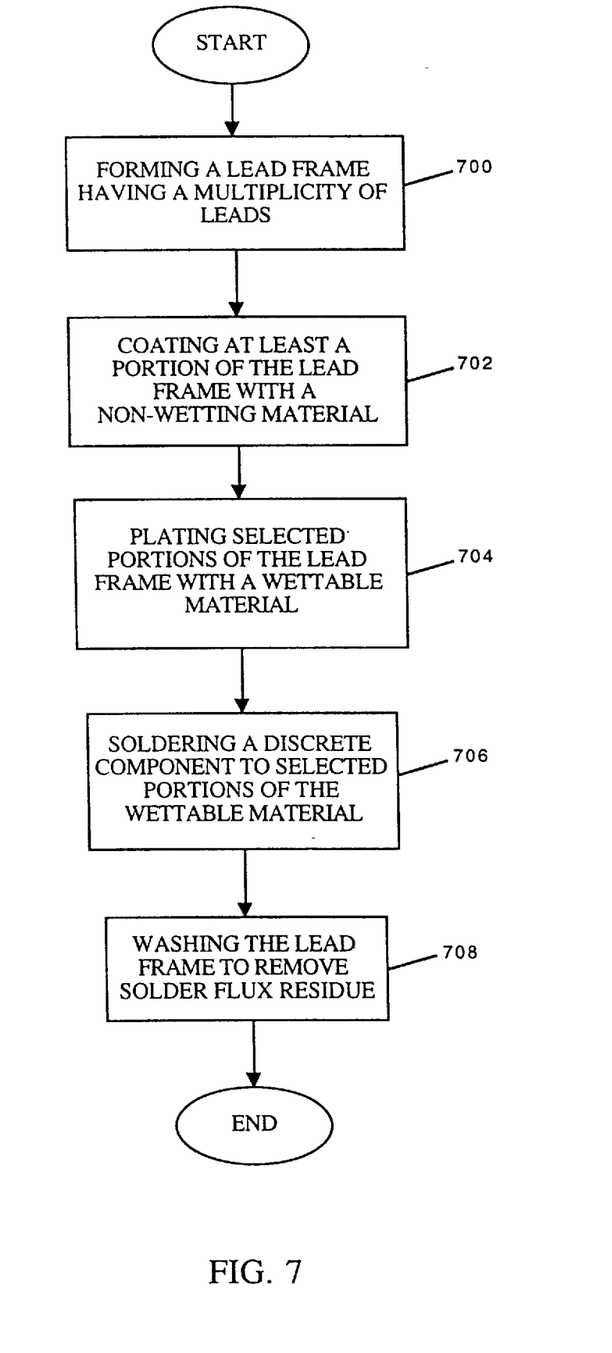
FIG. 7 is a flow chart illustrating a preferred method for making a lead frame in accordance with one embodiment of the present invention.

FIG. 7 is a flow chart illustrating a preferred method for making a lead frame in accordance with one embodiment of the present invention. The method starts at a step 700 where at least one lead frame is formed from a copper panel. The lead frame will preferably have a multiplicity of leads that may be interconnected by discrete components and wire bonds. The method then proceeds to a step 702 where at least a portion of the lead frame is coated with a non-wettable material. In a preferred embodiment, the non-wettable material is a nickel material that is preferably electroplated to a thickness of between about 0.5 microns and about 3 microns, and most preferably, to a thickness of about 1 micron.

Once the lead frame has been plated with the nickel material, the method proceeds to a step 704 where selected portions of the lead frame are plated with a wettable material. Preferably, the wettable material is silver, and is coated to a thickness of between about 1 microns and about 3 microns, and most preferably, to about 2 microns. The method now proceeds to a step 706 where a discrete component is placed over a solder paste that is applied to selected portions of the wettable material. The lead frame and the discrete component is then placed in an infrared reflow furnace in order to melt the solder material and bond the discrete components to the lead frame.

Advantageously, the solder material is confined to the wettable portions of the lead frame by the non-wetting material. At this point, the process proceeds to a step 708 where a washing operations is performed to remove any flux residue that may have flown over portions of the lead frame during the heating step. At this point, the process of making a lead frame that confines solder material to selected portions of the lead frame ends.

Although the preferred embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A lead frame suitable for electrical connection to a die and for supporting a non-die discrete component, the lead frame comprising:

a multiplicity of leads;

a non-wettable material that covers at least part of a selected one of the leads of the lead frame, the non-wettable material being arranged to repel a solder material; and a plurality of conductive attach pads covering selected portions of the lead frames, wherein at least a first one of the plurality of conductive attach pads is located on the selected lead and serves as a solderable region suitable for attaching the non-die discrete component to the selected lead, and a second one of the plurality of conductive attach pads is located on the selected lead and serves as a wire bondable region;

whereby the non-wettable material serves as a barrier to prevent the solder material used to attach the discrete component to the solderable region of the lead frame from spreading to the wire bondable region.

2. A lead frame as recited in claim 1, wherein said non-wettable material is selected from the group consisting of nickel, cobalt, nickel-iron, tin-nickel, chromium, aluminum, titanium and molybdenum.

3. A lead frame as recited in claim 1, wherein the wire bondable region is plated with a conductive material selected from the group consisting of silver, palladium and gold.

4. A lead frame as recited in claim 1, wherein the solderable region is plated with a conductive material selected from the group consisting of silver, palladium, gold, tin, tin-lead and tin alloys.

5. A lead frame as recited in claim 1, further comprising a locking aperture located on the selected lead, wherein the non-wettable material helps prevent the spread of the solder material from the solderable region to the locking aperture.

6. A lead frame as recited in claim 1, wherein the die is attached to the non-wettable material, whereby the non-wettable material helps prevent the spread of the solder material from the solderable region to the die located on the non-wettable material.

7. A semiconductor device comprising:

a lead frame including a multiplicity of leads wherein a selected one of the leads includes a solderable region and a non-wettable region, wherein the non-wettable region is covered by a non-wettable material;

a die electrically coupled to the lead frame; and a non-die discrete component soldered to the solderable region of the selected lead, whereby the non-wettable region prevents the spread of the solder material from the solderable region during the soldering of the non-die discrete component to the lead frame.

8. A semiconductor device as recited in claim 7 wherein the selected lead further includes a bondable region, the semiconductor device further comprising a plurality of interconnects for electrically coupling the die to the lead frame, wherein a selected one of the interconnects electrically couples the die to the bondable region of the selected lead, wherein the non-wettable region prevents the spread of the solder material from the solderable region to the bondable region.

9. A semiconductor device as recited in claim 7, further comprising a locking aperture located on the selected lead wherein the non-wettable region prevents the spread of the solder material from the solderable region to the locking aperture.

10. A semiconductor device as recited in claim 7 wherein the die is attached at least partially to the non-wettable region of the selected lead, whereby the non-wettable region prevents the spread of the solder material from the solderable region to the die.

11. A semiconductor device as recited in claim 8 wherein:

the lead frame further includes a second non-wettable region covered by the non-wettable material; and the die is at least partially attached to the second non-wettable region of the lead frame.

12. A semiconductor device as recited in claim 11, further comprising a locking aperture located on the selected lead wherein the non-wettable region of the selected lead further prevents the spread of the solder material from the solderable region to the locking aperture.

13. A semiconductor device as recited in claim 12 wherein the non-die discrete component is chosen from the group consisting of a resistor, a capacitor, an inductor, a crystal and a transistor.

14. A semiconductor device as recited in claim 7 wherein the non-die discrete component is chosen from the group consisting of a resistor, a capacitor, an inductor, a crystal and a transistor.

* * * * *